(12) United States Patent
Anta Martinez (10) Patent No.: US 10,444,714 B2
(45) Date of Patent: Oct. 15, 2019

(54) MACHINE MONITORING DEVICE (71) Applicant: GENERAL ELECTRIC COMPANY, Schenectady, NY (US)

(72) Inventor: Adolfo Anta Martinez, Bavaria (DE)

(73) Assignee: General Electric Company, Niskayuna, NY (US)

( * ) Notice: Subject to any disclaimer, the term of this patent is extended or adjusted under 35 U.S.C. 154(b) by 496 days.

(21) Appl. No.: 15/188,137

(22) Filed: Jun. 21, 2016

(65) Prior Publication Data

US 2017/0364042 A1 Dec. 21, 2017

(51) Int. Cl.
| | |
|---|---|
| G06G 7/48 | (2006.01) |
| G05B 13/04 | (2006.01) |
| G06F 17/11 | (2006.01) |
| G05B 23/02 | (2006.01) |
| G06F 17/50 | (2006.01) |

(52) U.S. Cl.
CPC ....... *G05B 13/048* (2013.01); *G05B 23/0254* (2013.01); *G05B 23/0256* (2013.01); *G06F 17/11* (2013.01); *G06F 17/50* (2013.01)

(58) Field of Classification Search
None
See application file for complete search history.

(56) References Cited

U.S. PATENT DOCUMENTS

| | | |
|---|---|---|
| 6,005,364 A | 12/1999 | Acarnley |
| 7,538,700 B2 | 5/2009 | Nagamoto |

(Continued)

FOREIGN PATENT DOCUMENTS

| | | |
|---|---|---|
| CN | 102564369 B | 1/2015 |
| EP | 1895180 A2 | 3/2008 |

(Continued)

OTHER PUBLICATIONS

Robison, Kevin E. et al., "Instrumented Composite Turbine Blade for Health Monitoring", 2012, Nondestructive Characterization for Composite Materials, Aerospace Engineering, Civil Infrastructure, and Homeland Security, SPIE. (Year: 2012).*

(Continued)

*Primary Examiner* — Cedric Johnson
(74) *Attorney, Agent, or Firm* — Baker Hughes Patent Organization (57) ABSTRACT

A machine monitoring device is provided which includes a communications link to interrogate a machine with a probe signal and receive one or more measured machine operating condition outputs; and a device controller capable of selecting a machine operating condition input variable for which a corresponding machine operating condition output is unknown; applying a predictive model in which the machine operating condition input variable serves as an argument of a predicted machine operating condition output; updating a library of predicted machine operating condition outputs; and alerting a human operator if a measured or predicted machine operating condition output exceeds a predetermined limit. The predictive model is based on at least two independent primary models having at least one correspondence between a primary model machine operating condition and a corresponding machine output. The primary models share a common basis in the predictive model.

20 Claims, 7 Drawing Sheets

(56) References Cited

U.S. PATENT DOCUMENTS

| | | | |
|---|---|---|---|
| 9,595,903 | B2 | 3/2017 | Hawes et al. |
| 2005/0193739 | A1* | 9/2005 | Brunell ................. G05B 13/042 60/772 |
| 2008/0082304 | A1* | 4/2008 | Miller ..................... G05B 17/02 703/9 |
| 2012/0029892 | A1* | 2/2012 | Thulke ..................... F03D 7/045 703/7 |
| 2012/0146561 | A1 | 6/2012 | Steinlechner et al. |
| 2013/0170947 | A1 | 7/2013 | Kurt-Elli et al. |
| 2015/0220067 | A1 | 8/2015 | Tsuneki |

FOREIGN PATENT DOCUMENTS

| | | | |
|---|---|---|---|
| EP | 2 149 824 | A2 | 2/2010 |
| EP | 2149824 | A2 * | 2/2010 ............. G05B 17/02 |
| EP | 2 690 513 | A1 | 1/2014 |
| EP | 2690513 | A1 * | 1/2014 ......... G05B 19/4055 |
| JP | 2001165163 | A | 6/2001 |

OTHER PUBLICATIONS

Kusiak, Andrew et al., "Prediction, Operations, and Condition Monitoring in Wind Energy", Aug. 23, 2013, Energy, Elsevier Ltd. (Year: 2013).*

Bonello et al., "Modelling the dynamic behaviour of a supercritical rotor on a flexible foundation using the mechanical impedance technique", Journal of Sound and Vibration, pp. 445-466, vol. 239 Issue: 3, Jan. 18, 2001.

Blom, R.S., "Model-based Process Monitoring and Control of Micro-milling using Active Magnetic Bearings," pp. 1-244 (2011).

Caigny, J.D., et al., "Identification of MIMO LPV models based on interpolation," Proceedings of ISMA, pp. 2631-2644 (2008).

Extended European Search Report and Opinion issued in connection with corresponding EP Application No. 17176585.2 dated Oct. 19, 2017.

* cited by examiner

MACHINE MONITORING DEVICE

This invention relates to devices useful for monitoring machine performance. In particular, the present invention relates to machine monitoring devices which rely in part on prediction of machine responses to changes in machine operating conditions.

BACKGROUND

Equipment monitoring devices are of fundamental importance to modern engineering. Increasingly, data taken from machines in operation is compared with models generated from earlier data taken from the same or similar machines to assure compliance with design specifications and to predict future performance. In large, complex machines such predictive models tend to be based on data gathered through painstaking experimentation during which machine operating conditions are systematically varied while machine outputs are recorded. Particularly when a machine is initially deployed, there may be little or no historical data available with which to predict machine responses to changes in machine operating conditions. A significant amount of historical data may be required in order to establish models useful in machine monitoring devices.

There is a need for machine monitoring devices which are capable of establishing useful predictive models with limited data, and which can alert operators to potential deviations from acceptable machine performance based on outputs of the predictive models.

BRIEF DESCRIPTION

In one embodiment, the present invention provides a machine monitoring device, the device comprising: (a) a communications link to interrogate a machine with a probe signal and receive one or more measured machine operating condition outputs; and (b) a device controller for: (i) selecting a machine operating condition input variable for which a corresponding machine operating condition output is unknown; (ii) applying a predictive model in which the machine operating condition input variable serves as an argument of a predicted machine operating condition output; (iii) updating a library of predicted machine operating condition outputs; and (iv) alerting a human operator if a measured or predicted machine operating condition output is at variance with a predetermined threshold machine operating condition output; wherein the predictive model comprises at least two independent primary models, for each of which primary models at least one correspondence between a primary model machine operating condition and a corresponding primary model machine output are known; the primary models sharing a single common basis within the predictive model.

In an alternate embodiment, the present invention provides a system comprising a machine monitoring device operationally coupled to a machine, the machine monitoring device comprising: (a) a communications link to interrogate the machine with a probe signal and receive one or more measured machine operating condition outputs; and (b) a device controller for: (i) selecting a machine operating condition input variable for which a corresponding machine operating condition output is unknown; (ii) applying a predictive model in which the machine operating condition input variable serves as an argument of a predicted machine operating condition output; (iii) updating a library of predicted machine operating condition outputs; and (iv) alerting a human operator if a measured or predicted machine operating condition output is at variance with a predetermined threshold machine operating condition output; wherein the predictive model comprises at least two independent primary models, for each of which primary models at least one correspondence between a primary model machine operating condition and a corresponding primary model machine output are known; the primary models sharing a single common basis within the predictive model.

In yet another embodiment, the present invention provides a method of monitoring a machine with a machine monitoring device, the method comprising: (a) interrogating a targeted machine component with a probe signal via a communications link and receiving one or more measured machine operating condition outputs; and (b) selecting a targeted machine component operating condition input variable for which a corresponding targeted machine component operating condition output is unknown; (c) applying a predictive model in which the targeted machine component operating condition input variable serves as an argument of a predicted targeted machine component operating condition output; (d) updating a library of predicted targeted machine component operating condition outputs; and (e) alerting a human operator if a measured or predicted targeted machine component operating condition output exceeds a predetermined threshold targeted machine component operating condition output; wherein the predictive model comprises at least two independent primary models, for each of which primary models at least one correspondence between a primary model targeted machine component operating condition and a corresponding primary model targeted machine component output are known; the primary models sharing a single common basis within the predictive model.

BRIEF DESCRIPTION OF THE DRAWING FIGURES

Various features, aspects, and advantages of the present invention will become better understood when the following detailed description is read with reference to the accompanying drawings in which like characters may represent like parts throughout the drawings. Unless otherwise indicated, the drawings provided herein are meant to illustrate key inventive features of the invention. These key inventive features are believed to be applicable in a wide variety of systems which comprising one or more embodiments of the invention. As such, the drawings are not meant to include all conventional features known by those of ordinary skill in the art to be required for the practice of the invention.

DETAILED DESCRIPTION

In the following specification and the claims, which follow, reference will be made to a number of terms, which shall be defined to have the following meanings.

The singular forms "a", "an", and "the" include plural referents unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In one or more embodiments the present invention provides a machine monitoring device useful for evaluating machine performance. The monitoring device is capable of interrogating the machine with one or more probe signals and receiving one or more measured machine operating condition outputs. In one or more embodiments, the probe signal interrogates the machine and generates a machine frequency response function (FRF) for a given machine operating condition, such as a given machine rotor speed. In addition, one or more sensors deployed in and/or around the machine may provide machine operating condition output data such as vibrational level, temperature, pressure, and displacement. Such machine operating condition output data may in turn be sent to the machine monitoring device controller via the communications link. In one or more embodiments, changes in the probe signal appear as changes in the frequency of onset of probe signal attenuation and/or amplification in response to a change in a machine operating condition. These changes are the result of machine-probe signal interactions and may be measured and correlated with one or more machine operating condition outputs. The extent to which the probe signal is altered, and the nature of such alteration may be a function of the state of the machine during interrogation by the probe signal. Thus, the machine may be in a stationary or an active operational (non-stationary) state. In either case, the probe signal may be sensitive to external parameters such as ambient temperature, ambient humidity, barometric pressure which also constitute elements of the machine state. Primarily, however, the probe signal will be sensitive to machine operational parameters such as machine component rotational speed, machine component temperature, machine component displacement, and the like.

Those of ordinary skill in the art will appreciate that a variety of probe signals are available for use in machine interrogation. These include electric signals, optical signals, acoustic signals, radiofrequency signals, and combinations thereof. In one or more embodiments, the probe signal is a high frequency electrical signal. In one or more alternate embodiments, the probe signal is an optical signal. In one or more embodiments, the probe signal is an orthogonal random phase multi-sine electrical signal such as are known in the art.

As noted, the machine monitoring device comprises a communications link which permits the device to interrogate one or more machine components with a probe signal, to receive measured machine operating condition outputs, and to detect changes in probe signal characteristics such as its attenuation as a function of frequency under different machine operating conditions. Machine operating condition outputs such as machine component vibrational level, machine component temperature and pressure will be dependent on the state of the machine at the time of its interrogation. It is useful to think of the machine state in terms of individual parameters such as rotational speed, or sets of parameters such as ambient temperature and rotational speed. Such individual parameters and sets of parameters are at times herein referred to as machine operating condition input variables. It follows that machine operating condition outputs reflect a machine state characterized at least in part by the individual parameter or set of parameters being considered.

In one or more embodiments, the communications link is configured such that a probe signal having known voltage and frequency characteristics may be injected into a machine power supply at a frequency greater than the fundamental electrical frequency (and its low order harmonics) powering the machine. This creates a high frequency current signal which may be measured as part of a voltage and current sensor interfaced with the power line. Such signal injection components are described in detail in co-pending U.S. patent application Ser. No. 14/663,691 filed Mar. 20, 2015 and which is incorporated herein by reference in its entirety.

In one aspect, an advantage offered by the machine monitoring device provided by the present invention lies in its ability to predict the machine operating condition output for which no correlation yet exists with a corresponding machine operating condition input variable. For example, a machine operating condition output such as the vibrational state of a machine component of an untested machine state may be predicted in advance of testing at such machine state, or in many cases in lieu of such testing. The predictive power of the machine monitoring device thus enables the more rapid deployment and commissioning of complex machines such as compressors and turbines, and can also alert operators to potential problems when a measured or predicted machine operating condition output is at variance with a predetermined threshold machine operating condition output.

Thus in one or more embodiments, a device controller may be programmed to select a machine operating condition input variable, for example a rotor speed, for which a corresponding machine operating condition output is unknown. The controller applies a predictive model of the machine's performance wherein the input variable, for example rotor speed, serves as an argument of a predicted machine operating condition output, for example the expected vibrational level of a particular machine component at the given rotor speed. The controller then updates a library of predicted machine operating condition outputs. The controller is similarly configured to update a library of measured machine operating condition outputs which may be used to update the predictive model. Finally, the device controller is programmed to alert a human operator if a measured or predicted machine operating condition output is at variance with a predetermined threshold machine operating condition output.

The predictive model, described in detail herein, relies upon at least two independent primary models. Each of the primary models includes at least one known correspondence between a primary model machine operating condition and a corresponding primary model machine output. Such correspondences are illustrated by frequency response plots 401 and 402 shown in FIG. 4, at times herein referred to as frequency response functions (FRFs). FRFs 401 and 402 were experimentally determined on a rotary test rig being interrogated by a complex electrical probe signal of the orthogonal random phase multi-sine type superimposed onto the test rig power supply. Within the predictive model, the primary models share a common basis. The primary models themselves may or may not initially share a common basis. Where the primary models do not share a common basis, conversion to a common basis as components of the predictive model is required.

In one or more embodiments, primary model machine outputs and the predicted machine operating condition output include one or more of a machine temperature, a machine pressure, a machine vibrational characteristic, a machine rotational speed, a machine translational speed, a machine acceleration, a machine force, a machine torque, a machine power input variable, time of operation, machine age, a machine weight characteristic, a machine geometry characteristic, and a characteristic of matter being processed by the machine.

The predictive model is created by first creating and combining at least two independent primary models. The independent primary models can be created using known modeling tools such as MATLAB using a limited number of correspondences between a machine operating condition and a corresponding machine output.

Figure 1:
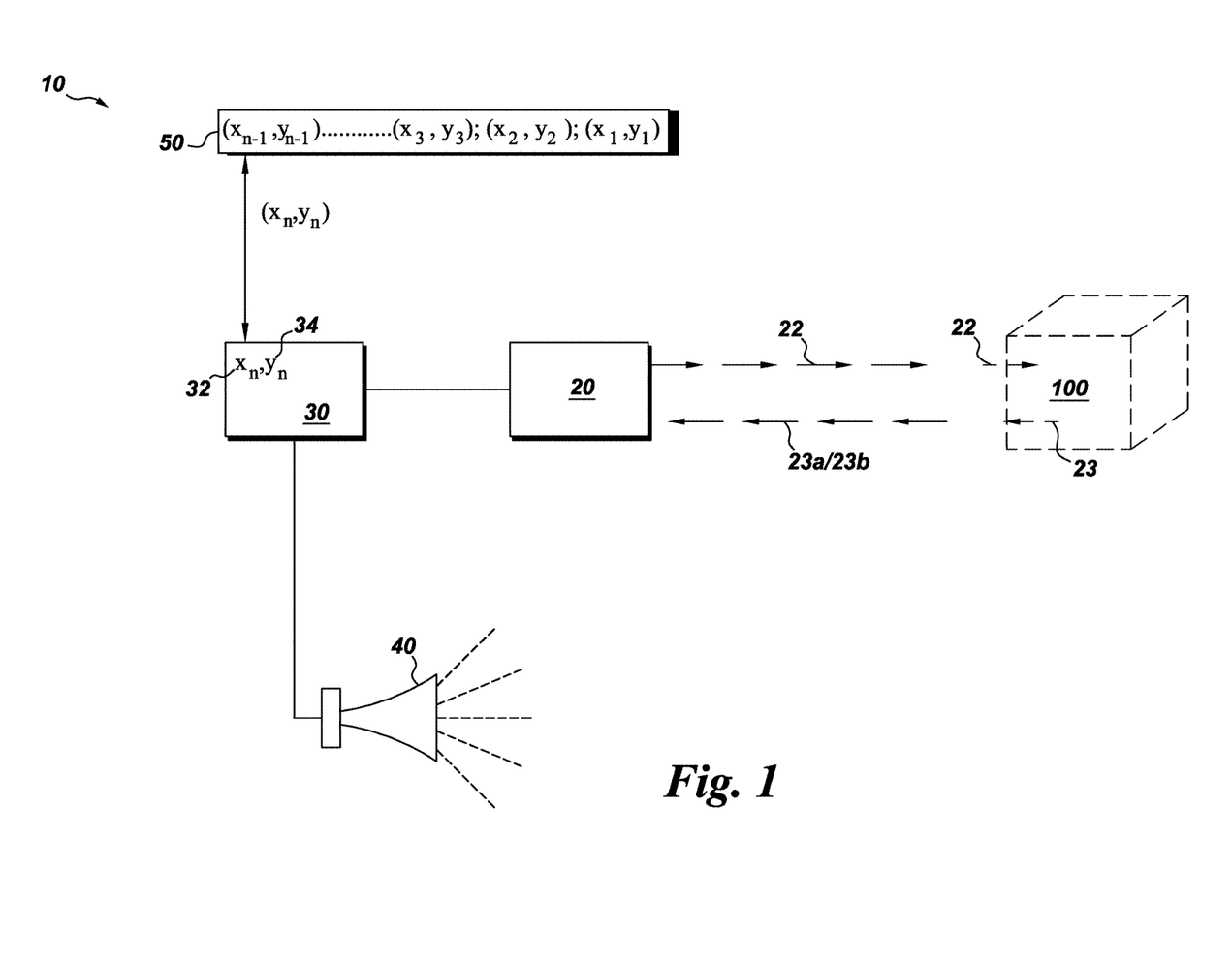
FIG. 1 illustrates a machine monitoring device provided by the present invention.

Turning now to the figures, FIG. 1 illustrates a machine monitoring device 10 provided by the present invention. In the embodiment shown, a communications link 20 transmits a probe signal 22 to a machine 100 being monitored at a limited number of machine operating conditions and receives data 23 from the machine. In one or more embodiments, the data is detected as the attenuation and/or amplification 23a of the probe signal as a function of frequency which is used to generate a frequency response function (FRF) for a given machine operating condition. In addition, machine sensor data 23b is received through the communications link during this limited operation of the machine. Thus, during a limited set of machine operating conditions designated input variables, for example rotor speeds $X_1$, $X_2$, and $X_3$, and the corresponding machine operating condition outputs $Y_1$, $Y_2$, and $Y_3$ are recorded by the machine monitoring device. Again, these operating condition outputs include both the machine frequency response behavior 23a and machine sensor data 23b. The limited number of such X to Y correspondences are used in combination with the predictive model discussed above to predict machine operating condition outputs ($Y_{n+1}$, $Y_n$, $Y_{n-1}$ . . . ) for which such correspondences with machine operating input variables ($X_{n+1}$, $X_n$, $X_{n-1}$ . . . ) are unknown. In the embodiment shown, device controller 30 has access to a range of machine operating inputs $X_1$-$X_{n+1}$. The device controller selects a machine operating input variable $X_n$ 32 for which a corresponding machine operating condition output $Y_n$ 34 is unknown and predicts such output. A library 50 containing predicted machine operating condition outputs is then updated. The machine monitoring device alerts a human operator via alerting unit 40 if the machine operating condition output $Y_n$ 34 is at variance with a predetermined threshold machine operating condition output. In one or more embodiments, this is carried out by comparing the machine operating condition output 34 with a predetermined acceptable range of machine operating condition outputs. In one or more embodiments, the alerting unit 40 comprises a control center computer, a portable electronic device, an optical warning device, an audible warning device or a combination of two or more of the foregoing.

In one or more embodiments, the machine operating condition input variable $X_n$ is extrapolative relative to at least two X to Y correspondences between the primary model machine operating conditions and the corresponding primary model machine outputs. In one or more alternate embodiments, the machine operating condition input variable $X_n$ is interpolative relative to at least two X to Y correspondences between the primary model machine operating conditions and the corresponding primary model machine outputs.

Figure 2:
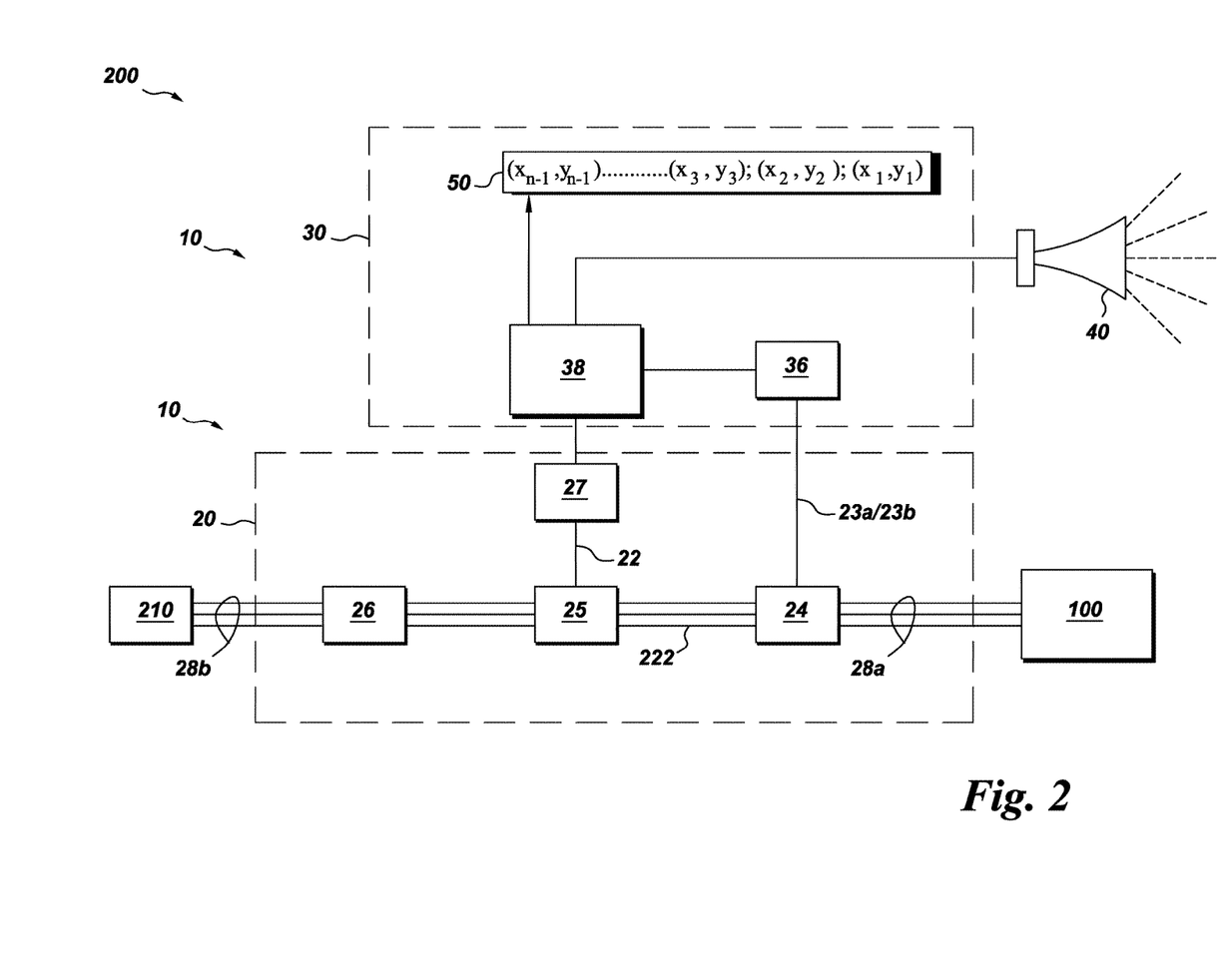
FIG. 2 illustrates a system provided by the present invention.

Referring to FIG. 2, the figure represents a system 200 provided by the present invention, the system comprising a machine 100 powered by a variable frequency drive 210, the machine being monitored by machine monitoring device 10, machine monitoring device 10 comprising as subunits, communications link 20 and controller 30. In the embodiment shown, the machine monitoring device 10 is operationally coupled to the machine 100 via a power transmission cable 222 linking the machine to the associated variable frequency drive 210. The machine monitoring device 10 is configured to interface with the machine 100 via electrical interface 28a and the variable frequency drive 210 via electrical interface 28b. As such, the machine monitoring device 10 also serves as the electrical connection between the variable frequency drive and allied components on the one hand, and the machine driven by the variable frequency drive on the other. Machine monitoring device 10 functions essentially as described in the discussion of FIG. 1 and elsewhere herein. In the embodiment shown, a high frequency electric probe signal 22 interrogates the machine 100 via power transmission cable 222 via a capacitive or inductive coupling unit 25 attached to the power transmission cable. The probe signal 22 is generated by processor-microcontroller unit 38 working in tandem with switching network 27 to inject the probe signal directly into the power transmission cable. Blocking filter 26 inhibits the transmission of the probe signal into other components of the system, such as the variable frequency drive. Attenuation and/or amplification of probe signal 23a and machine sensor signals 23b are detected by voltage current sensor 24 and are transmitted to processor-microcontroller unit 38 via analog to digital converter 36. As discussed in reference to FIG. 1, a library, 50, containing measured and predicted machine operating condition outputs is updated during the course of operation of the machine. The machine monitoring device alerts a human operator via alerting unit 40 if one or more measured or predicted machine operating condition outputs is at variance with a predetermined threshold machine operating condition output.

Figure 3:
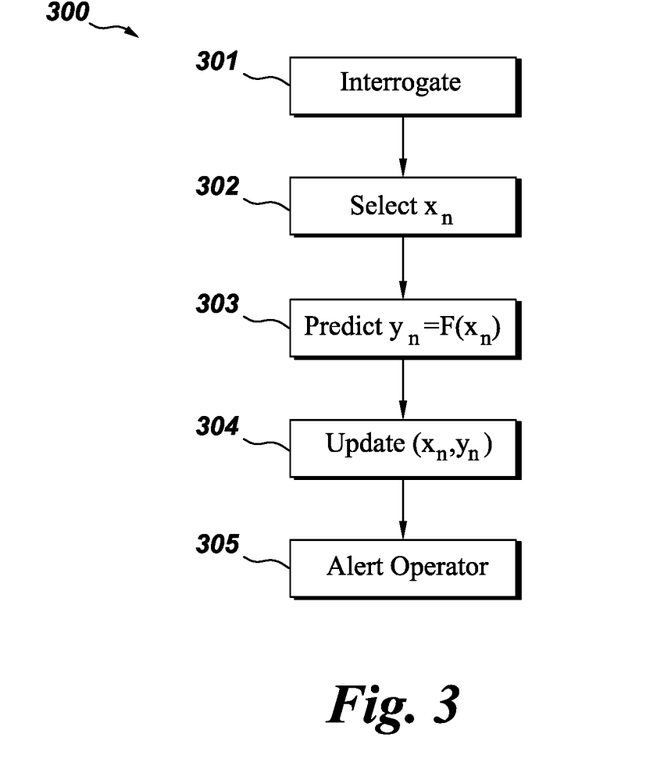
FIG. 3 illustrates a method provided by the present invention.

Referring to FIG. 3, the figure illustrates a method 300 of monitoring a machine according to one or more embodiments of the present invention. In a first method step 301, a targeted machine component, for example an active magnetic bearing, is interrogated with a probe signal via a communications link. Such interrogation comprises operating the machine at a first operating condition and measuring the alteration of the probe signal resulting at least in part by the interaction of the probe signal with the targeted machine component, and recording the correspondence between the alteration of the probe signal with the first operating condition. A given machine operating condition may at times herein be referred to as a machine component operating condition input variable. Similarly, the alteration of the probe signal at the given machine operating condition may at times herein be referred to as the machine component operating condition output. In addition to recording the frequency response behavior of the probe signal, one or more machine component attributes, for example rotor displacement within the targeted magnetic bearing is sensed and recorded via the communications link during the operation of the machine at the first operating condition. Such machine component attributes also constitute machine operating condition outputs. In a second method step, 302, a targeted machine component operating condition input variable, for example a rotor speed, is selected for which a corresponding targeted machine component operating condition output is unknown. In a third method step, 303, a predictive model is applied in which the targeted machine component operating condition input variable serves as an argument of a predicted targeted machine component operating condition output. The predictive model comprises at least two independent primary models, for each of which primary models at least one correspondence between a primary model targeted machine component operating condition and a corresponding primary model targeted machine component output are known; the primary models sharing or having been converted into the predictive model in which the primary models share a single common basis. In a fourth method step, 304, a library of predicted targeted machine component operating condition outputs is updated. In a fifth method step, 305, a human operator is alerted if a predicted targeted machine component operating condition output is at variance with a predetermined threshold targeted machine component operating condition output.

Figure 4:
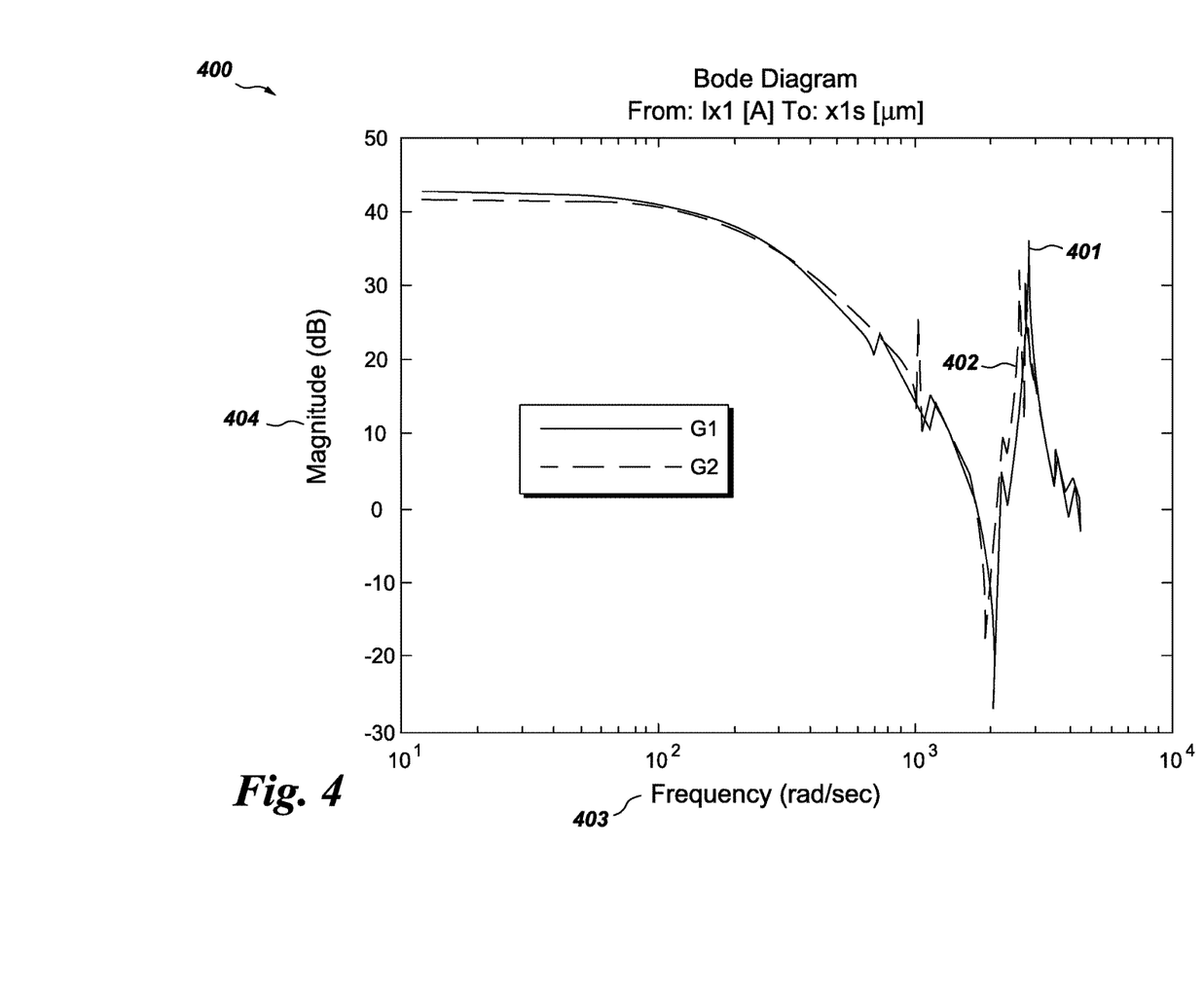
FIG. 4 illustrates frequency responses of a machine to a probe signal according to one or more embodiments of the present invention.

Referring to FIG. 4, the figure represents a frequency response 400 of a machine to a probe signal according to one or more embodiments of the present invention and shows the magnitude 404 of the probe signal as a function of the frequency 403 of the probe signal. In the embodiment shown, a machine first frequency response function (FRF) 401 is obtained at a first rotor speed $\Omega_1$ and a second frequency response function 402 of the same machine is obtained at a second rotor speed $\Omega_2$. For example, the probe signal, at times herein referred to as an excitation signal, may be applied to one or more machine components such as a stator coil or a magnetic bearing at different rotor speeds. The illustrated frequency response functions 401 and 402 are obtained by applying the probe signal at rotor speed $\Omega_1$ and subsequently applying the same probe signal at rotor speed $\Omega_2$ and measuring the machine-induced alteration of the probe signal embodied in plots 401 and 402. In this example, rotor speeds $\Omega_1$ and $\Omega_2$ represent machine operating condition input variables and frequency responses 401 and 402 represent machine operating condition outputs and may serve as components, together with sensed machine attributes such as vibrational levels, of independent primary models with which to create a predictive model capable of predicting machine operating condition outputs in response to the probe signal under untested machine operating conditions, rotor speeds $\Omega_3$-$\Omega_n$.

In one or more embodiments, the machine monitoring device computes the predictive model by constructing a common basis for the available primary models of machine behavior. In order to draw parallelisms and establish connections between the two (or more) available primary models, it is first necessary to ensure that the coordinates of both models coincide, that is, state vector x in the state space description corresponds to the same set of variables in both models. A common basis or coordinates set for all available models is then obtained. Since the at least two of the primary models were obtained from experimental data gathered under different machine operating conditions (e.g. different rotor speeds), there is no guarantee that the two state space representations use the same set of coordinates for each state. The inputs and outputs are clearly defined since they correspond to physical signals (e.g. vibrations and currents in the Example herein), but the same cannot be guaranteed for the states. In one or more embodiments, the machine monitoring device controller computes a common basis for the primary models by (i) choosing an input/output pair of the multiple-input multiple-output system, (ii) computing the poles and zeros of this single-input single-output (SISO) system and sorting these poles and zeros in the same order for all systems, and (iii) dividing this SISO system into a combination of first order and second order subsystems and applying a canonical transformation to each subsystem. This representation is unique provided the sorting in step is done properly. Once all available systems have been transformed, an interpolation or extrapolation can be done directly on the mathematical models.

Additional guidance on methodologies used herein is available in Blom R. S., Delft, 2011, 244 pages, ISBN: 9789491104077 and J. De Caigny et al. Proceedings of ISMA2008 which are incorporated by reference herein in their entirety.

EXAMPLE

Figure 5:
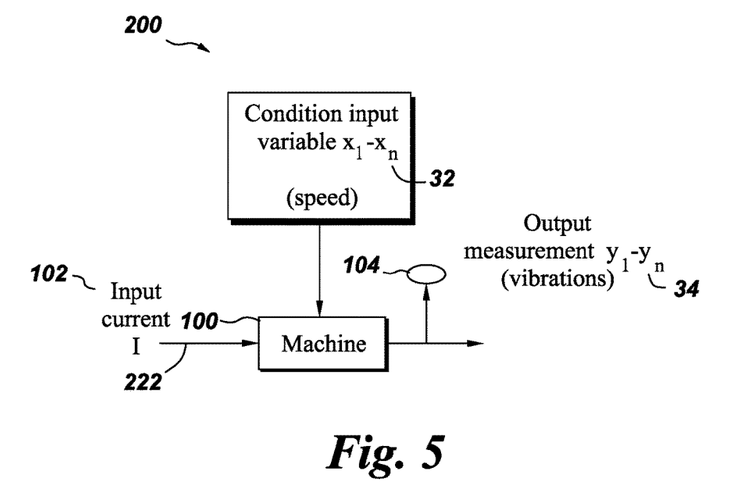
FIG. 5 illustrates one or more aspects of the present invention.

We consider here the deployment and commissioning of a machine whose behavior depends on the rotor speed having a nominal operating range of 0 to 1000 rpm. In this example, a requirement for safe operation is that the vibrations in the machine do not surpass 3 centimeter per second squared (3 cm/s$^2$). The magnitude of machine vibrations increases as the rotor speed of the machine increases. In order to commission this machine, it is necessary to demonstrate that vibrations will not exceed the 3 cm/s$^2$ safety requirement. A comparative system 200 in normal operation is depicted in FIG. 5. wherein electric current I 102 is provided via cable 222 to power a machine 100 while sensor 104 senses and transmits the vibrational level 34 ($Y_1$ to $Y_n$) of the machine at machine speeds $X_1$ to $X_n$. Again, the vibration level of the machine depends on the rotor speed X (32) of the machine which in turn depends on the input current 102.

The commissioning of the machine shown in FIG. 5 would be carried out as follows. First, the vibrational level of the machine at 0 rpm is measured. If the safe vibrational level is not exceeded, the rotor speed of the machine is increased to 100 rpm and the vibration level is again be measured. If the safe vibrational level is not exceeded, the rotor speed of the machine would be increased to 200 rpm and the vibration level would again be measured. This incremental approach would be repeated until the maximum nominal operating speed (1000 rpm) is reached.

Such conventional commissioning procedures are inherently limited. First, it is time consuming to repeat measurements at incrementally increasing speeds across the desired operational range. Second, because the true vibrational behavior of the machine during operation is unknown until the machine is put into operation, critical threshold vibrational limits may be exceeded during initial testing. Under various circumstances, including unforeseen and undetected damage done to the machine during transport, there is a risk that a machine will not function properly even within its nominal range of operating conditions. Under such circumstances, as the speed is increased within the nominal operating range, the machine vibrational level could exceed a predetermined threshold operating vibrational level, 3 cm/s² in this example, and be damaged. In large high kinetic energy rotating machines such excursions can be catastrophic.

Figure 6:
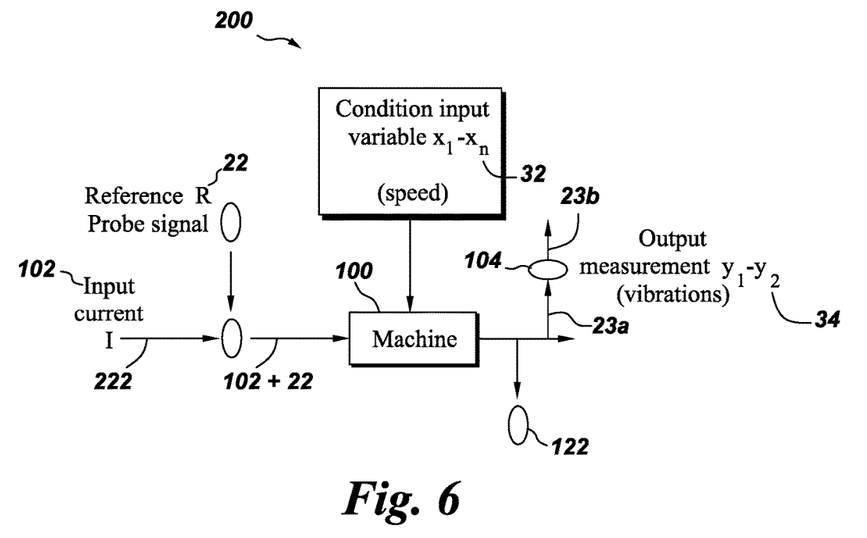
FIG. 6 illustrates one or more aspects of the present invention.

The present invention, illustrated by the non-limiting embodiment shown in FIG. 6, provides solutions to these and other challenges. Thus, primary models of the machine in operation are obtained at 0 rpm and at 100 rpm, speeds at which the machine vibrations are expected to be very low and therefore safe operation is highly probable. The primary models either initially share a common basis or are converted into primary models sharing a common basis before being incorporated into a predictive model which can be used to obtain a prediction of the vibration levels for any speed in the range 0 rpm to 1000 rpm.

Figure 7:
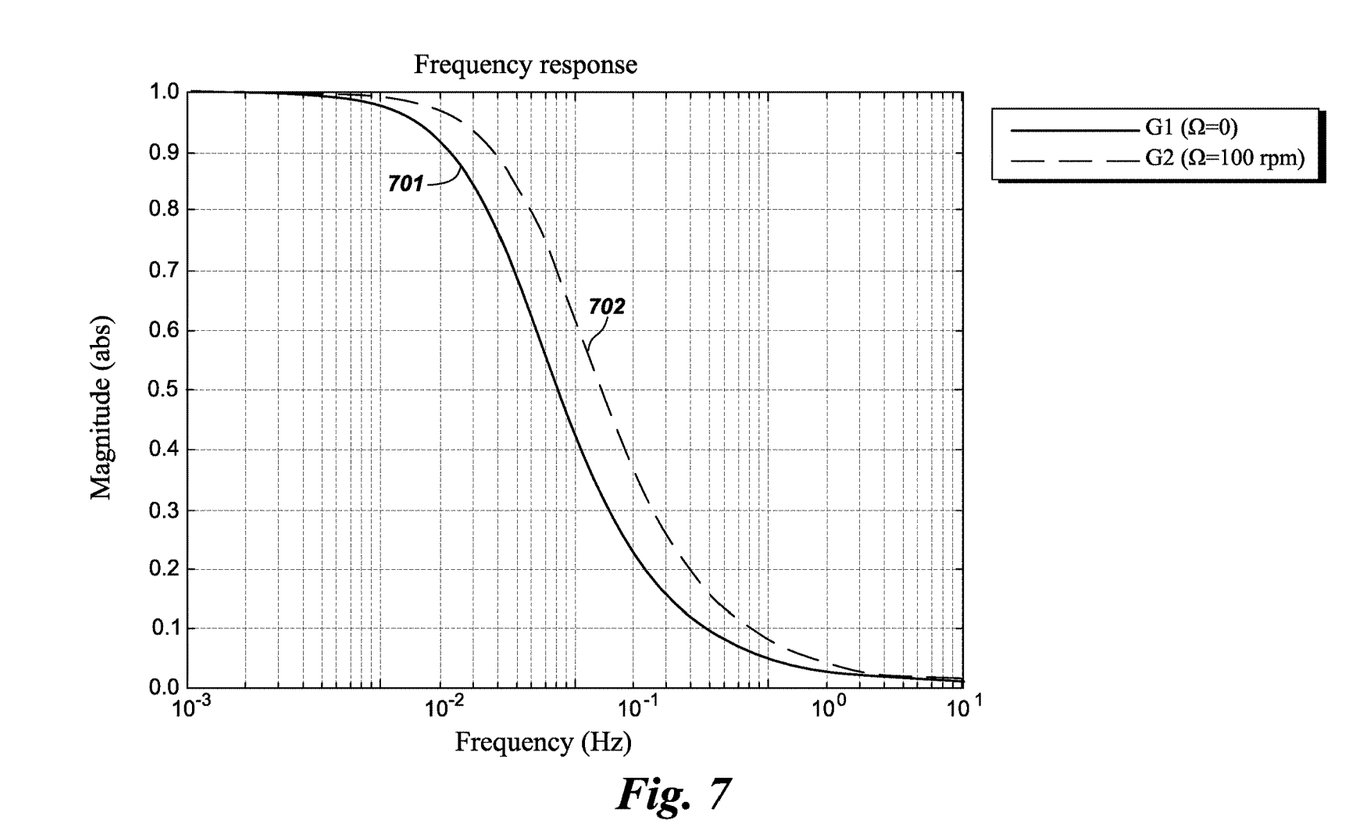
FIG. 7 illustrates frequency responses of a machine to a probe signal under two different machine operating conditions.

The present invention requires only measurements of two machine operating condition outputs; the frequency response function of a probe signal reference and the measured vibrational level at 0 rpm and 100 rpm. To obtain a predictive model in this example, the machine is probed with a probe signal R (22) (in this example an auxiliary current) to interrogate and study the machine response. The probe signal is injected into power supply cable 222 where it is added to machine input current 102. The present invention requires only one probe signal be used to record frequency response functions for the machine at two speeds 0 rpm and 100 rpm. In the embodiment shown, the attenuated and/or amplified probe signal 23b is detected at machine sensor 122 and relayed via a communications link 20 to a machine monitoring device controller 30. These frequency response functions $G_1$ (701) and $G_2$ (702) are shown in FIG. 7. Because one of the two speeds is 0 rpm, a single input current corresponding to a machine speed of 100 rpm may be used. At 0 rpm the same input current required to produce a machine speed of 100 rpm is applied, but the machine is mechanically locked in a stationary state. Machine vibration levels $Y_1$ and $Y_2$ (34) corresponding to machine speeds 0 rpm and 100 rpm are measured via a sensor 104 (FIG. 6). The vibration levels $Y_1$ and $Y_2$ are a function of the machine operating condition input variable (speed), the probe signal 22 magnitude (R) and the input current 102 (I). In this example the probe signal 22 is a sine wave and the input current 102 is held constant at two amperes (I(t)=2 amperes). The magnitude R of probe signal 22 varies with time and can be expressed mathematically as $R(t)=\sin(2t)$(amperes).

The measured vibration levels also vary with time at constant speed. Vibrational data is collected from sensor 104. In stationary state (0 rpm) the vibrational level of the machine can be expressed $Y_1(t)=2+0.5\sin(0.5t)(cm/s^2)$.

Similarly, the measured vibration level when the machine is rotating at 100 rpm may be expressed as $Y_2(t)=2+0.7\sin(0.5t)(cm/s^2)$.

Figure 8:
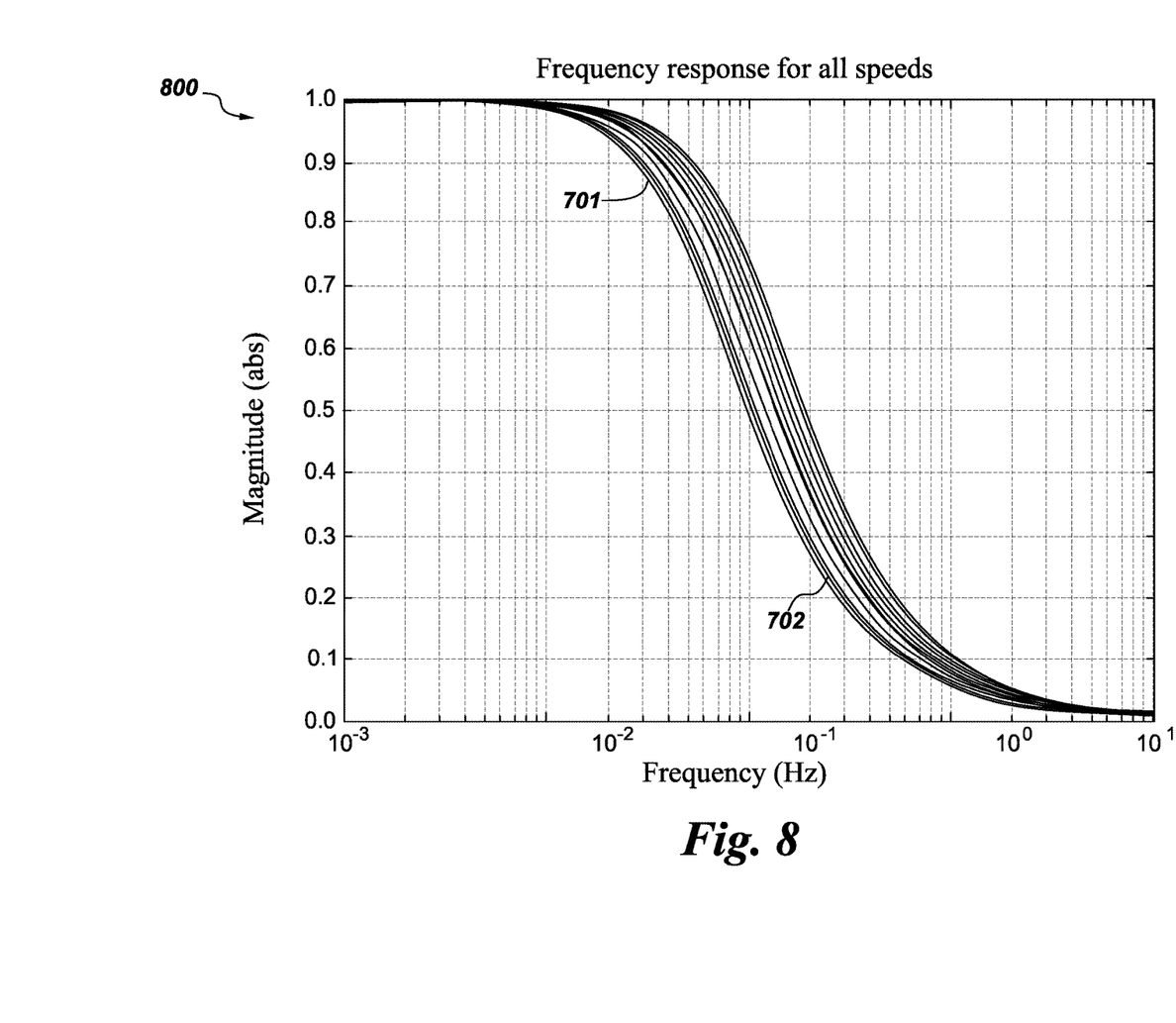
FIG. 8 illustrates a graphical representation of a predictive model according to one or more embodiments of the present invention.

Next, the frequency response functions $G_1$ (701) and $G_2$ (702) (FIG. 7) can be parametrized using art known parametrization techniques and expressed mathematically as $$G_1(s) = \frac{0.3}{s|0.3} \text{ and } G_2(s) = \frac{0.5}{s+0.5}$$

having units of cm/s²/ampere and wherein s is the probe signal frequency. The predictive model for all machine speeds the can be expressed as a transfer function $$G_\Omega(s) = \frac{0.3 + 0.2/100\,\Omega}{s + 0.3 + 0.2/100\,\Omega}$$

having units of cm/s²/ampere. The predictive model can be represented as well by the family of frequency response functions 800 shown in FIG. 8 wherein each curve illustrates machine vibration output at a given speed within the range 0 rpm to 100 rpm. Those of ordinary skill in the art will understand that, in the example just given $Y_1(t)$, $Y_2(t)$, $G_1(s)$ and $G_2(s)$ constitute the primary models used to generate the predictive model.

The foregoing examples are merely illustrative, serving to illustrate only some of the features of the invention. The appended claims are intended to claim the invention as broadly as it has been conceived and the examples herein presented are illustrative of selected embodiments from a manifold of all possible embodiments. Accordingly, it is Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of" Where necessary, ranges have been supplied, those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

What is claimed is:

1. A machine monitoring device, the device comprising:
   (a) a communications link to interrogate the machine with a probe signal and receive one or more measured machine operating condition outputs; and
   (b) a device controller for:
      (i) selecting a machine operating condition input variable for which a corresponding machine operating condition output is unknown;
      (ii) applying a predictive model in which the machine operating condition input variable serves as an argument of a predicted machine operating condition output, the predictive model comprising at least two independent primary models, for each of which at least one correspondence between a primary model machine operating condition and a corresponding primary model machine output are known, the primary models sharing or having been converted into the predictive model within which the primary models share a single common basis;
      (iii) updating a library of predicted machine operating condition outputs; and (iv) alerting a human operator if a measured or predicted machine operating condition output is at variance with a predetermined threshold machine operating condition output;
wherein the at least two independent primary models (i) do not share a common basis prior to being converted into the predictive model, or (ii) share a common basis prior to being converted into the predictive model.

2. The machine monitoring device according to claim 1, wherein the primary model machine outputs and the predicted machine operating condition output include one or more of a machine temperature, a machine pressure, a machine vibrational characteristic, a machine rotational speed, a machine translational speed, a machine acceleration, a machine force, a machine torque, a machine power input variable, time of operation, machine age, a machine weight characteristic, a machine geometry characteristic, a characteristic of matter being processed by the machine.

3. The machine monitoring device according to claim 1, wherein the primary model machine outputs and the predicted machine operating condition output includes a machine component rotational speed.

4. The machine monitoring device according to claim 1, wherein the primary model machine outputs reflect the machine in non-stationary states.

5. The machine monitoring device according to claim 1, wherein the machine is selected from the group consisting of turbines, wind turbines, compressors, turboexpanders, motors, and pumps.

6. The machine monitoring device according to claim 1, wherein the probe signal is a high frequency electrical signal.

7. The machine monitoring device according to claim 1, wherein the probe signal is an optical signal.

8. The machine monitoring device according to claim 1, wherein the one or more measured machine operating condition outputs reflect a state of the machine characterized by a plurality of machine operating condition input variables.

9. A machine monitoring device, the device comprising:
(a) a communications link to interrogate the machine with a probe signal and receive one or more measured machine operating condition outputs; and
(b) a device controller for:
    (i) selecting a machine operating condition input variable for which a corresponding machine operating condition output is unknown;
    (ii) applying a predictive model in which the machine operating condition input variable serves as an argument of a predicted machine operating condition output, the predictive model comprising at least two independent primary models, for each of which at least one correspondence between a primary model machine operating condition and a corresponding primary model machine output are known, the primary models sharing or having been converted into the predictive model within which the primary models share a single common basis;
    (iii) updating a library of predicted machine operating condition outputs; and
    (iv) alerting a human operator if a measured or predicted machine operating condition output is at variance with a predetermined threshold machine operating condition output,
wherein the machine operating condition input variable is
    (i) extrapolative relative to at least two correspondences between the primary model machine operating condition and the corresponding primary model machine output, or (ii) is interpolative relative to at least two correspondences between the primary model machine operating condition and the corresponding primary model machine output.

10. A system comprising:
a machine monitoring device operationally coupled to a machine, the machine monitoring device comprising:
(a) a communications link to interrogate the machine with a probe signal and receive one or more measured machine operating condition outputs; and
(b) a device controller for:
    (i) selecting a machine operating condition input variable for which a corresponding machine operating condition output is unknown;
    (ii) applying a predictive model in which the machine operating condition input variable serves as an argument of a predicted machine operating condition output, the predictive model comprising at least two independent primary models, for each of which at least one correspondence between a primary model machine operating condition and a corresponding primary model machine output are known, the primary models sharing or having been converted into the predictive model within which the primary models share a single common basis;
    (iii) updating a library of predicted machine operating condition outputs; and
    (iv) alerting a human operator if a measured or predicted machine operating condition output is at variance with a predetermined threshold machine operating condition output,
wherein the at least two independent primary models (i) do not share a common basis prior to being converted into the predictive model, or (ii) share a common basis prior to being converted into the predictive model.

11. The system according to claim 10, wherein the machine operating condition input variable is selected from the group consisting of a machine temperature, a machine pressure, a machine vibrational characteristic, a machine rotational speed, a machine translational speed, a machine acceleration, a machine force, a machine torque, a machine power input variable, time of operation, machine age, a machine weight characteristic, a machine geometry characteristic, a characteristic of matter being processed by the machine.

12. The system according to claim 10, wherein the machine is selected from the group consisting of turbines, wind turbines, compressors, turboexpanders, motors, and pumps.

13. The system according to claim 10, wherein the one or more measured machine operating condition outputs reflect a state of the machine characterized by a plurality of machine operating condition input variables.

14. A system comprising:
a machine monitoring device operationally coupled to a machine, the machine monitoring device comprising:
(a) a communications link to interrogate the machine with a probe signal and receive one or more measured machine operating condition outputs; and
(b) a device controller for:
    (i) selecting a machine operating condition input variable for which a corresponding machine operating condition output is unknown;
    (ii) applying a predictive model in which the machine operating condition input variable serves as an argument of a predicted machine operating condition output, the predictive model comprising at least two independent primary models, for each of which at least one correspondence between a primary model machine operating condition and a corresponding primary model machine output are known, the primary models sharing or having been converted into the predictive model within which the primary models share a single common basis;

(iii) updating a library of predicted machine operating condition outputs; and (iv) alerting a human operator if a measured or predicted machine operating condition output is at variance with a predetermined threshold machine operating condition output, wherein the machine operating condition input variable is (i) extrapolative relative to at least two correspondences between the primary model machine operating condition and the corresponding primary model machine output, or (ii) interpolative relative to at least two correspondences between the primary model machine operating condition and the corresponding primary model machine output.

15. A method of monitoring a machine with a machine monitoring device, the method comprising:

(a) interrogating a targeted machine component with a probe signal via a communications link and receiving one or more measured machine operating condition outputs;

(b) selecting a targeted machine component operating condition input variable for which a corresponding targeted machine component operating condition output is unknown;

(c) applying a predictive model in which the targeted machine component operating condition input variable serves as an argument of a predicted targeted machine component operating condition output, the predictive model comprising at least two independent primary models, for each of which, at least one correspondence between a primary model targeted machine component operating condition and a corresponding primary model targeted machine component output are known, the primary models sharing or having been converted into the predictive model within which the primary models share a single common basis;

(d) updating a library of predicted targeted machine component operating condition outputs; and (e) alerting a human operator if a measured or predicted targeted machine component operating condition output is at variance with a predetermined threshold targeted machine component operating condition output, wherein the at least two independent primary models (i) do not share a common basis prior to being converted into the predictive model, or (ii) share a common basis prior to being converted into the predictive model.

16. The method according to claim 15, wherein the targeted machine component is a rotor.

17. The method according to claim 15, wherein the targeted machine component is a rotor of a permanent magnet motor.

18. The method according to claim 15, wherein the targeted machine component is a bearing.

19. The method according to claim 18, wherein the targeted machine component is a magnetic bearing.

20. The method according to claim 15, wherein the one or more measured machine operating condition outputs reflect a state of the machine characterized by a plurality of machine operating condition input variables.

* * * * *